United States Patent [19]

Shibata et al.

[11] 4,383,178
[45] May 10, 1983

[54] SYSTEM FOR DRIVING ROTARY MEMBER IN VACUUM

[75] Inventors: Atsushi Shibata, Katsuta; Takeshi Koike, Ibaraki, both of Japan

[73] Assignee: Hitachi, Ltd., Tokyo, Japan

[21] Appl. No.: 252,784

[22] Filed: Apr. 10, 1981

[30] Foreign Application Priority Data

Apr. 11, 1980 [JP] Japan ................... 55-46900

[51] Int. Cl.³ .................. H01J 37/00; G21K 5/10
[52] U.S. Cl. .................. 250/441.1; 250/442.1; 250/492.2
[58] Field of Search ........... 250/441.1, 442.1, 492.2; 414/8, 217, 292

[56] References Cited

U.S. PATENT DOCUMENTS

| | | | |
|---|---|---|---|
| 2,220,973 | 11/1940 | Morton | 250/441.1 |
| 2,440,067 | 4/1948 | Bemsen | 250/441.1 |
| 3,983,402 | 9/1976 | Lorenz et al. | 250/441.1 |
| 4,247,781 | 1/1981 | Boyer et al. | 250/492.2 |
| 4,274,004 | 6/1981 | Kanai | 250/442.1 |

*Primary Examiner*—Bruce C. Anderson
*Attorney, Agent, or Firm*—Antonelli, Terry & Wands

[57] ABSTRACT

A system for driving a rotary member for implanting ions into wafers of semiconductor devices includes a first vacuum chamber receiving the rotary member connected to a rotary shaft through a vacuum seal supported in the central portion of a shield which defines a part of the first vacuum chamber, and a second vacuum chamber receiving a peripheral portion of a shield in airtight relation. The shield is supported by two pairs of O-rings mounted in the second vacuum chamber and arranged in juxtaposed relation on opposite sides of the peripheral portion of the shield. The O-rings provide a hermetical seal to the first and second vacuum chambers. A motor is operatively connected to the rotary shaft for rotating the rotary member, and the shield is connected to another motor through a nut-and-screw arrangement. By moving the shield in reciprocatory movement to cause the peripheral portion to move in sliding movement in the second vacuum chamber, the rotary member can be moved in reciprocatory movement in the plane of its rotation without the risk of the vacuum in the first vacuum chamber being interferred with.

5 Claims, 3 Drawing Figures

SYSTEM FOR DRIVING ROTARY MEMBER IN VACUUM

FIELD OF THE INVENTION

This invention relates to a system for driving a rotary member supported in an evacuated chamber, and more particularly it is concerned with a system for rotating a wafer-loaded disc supported in an evacuated chamber of an ion implantation system while moving same in reciprocatory movement in the plane of its rotation.

BRIEF DESCRIPTION OF THE DRAWINGS

In all the drawings, the same or similar parts are designated by like reference characters.

DESCRIPTION OF THE PRIOR ART

A system for mechanically rotating a rotary member supported in an evacuated chamber from outside while moving same in reciprocatory movement in the plane of its rotation is indispensable to an ion implantation system of the fixed ion beam type. Various proposals have hitherto been made for improving this type of drive system.

Figure 1:
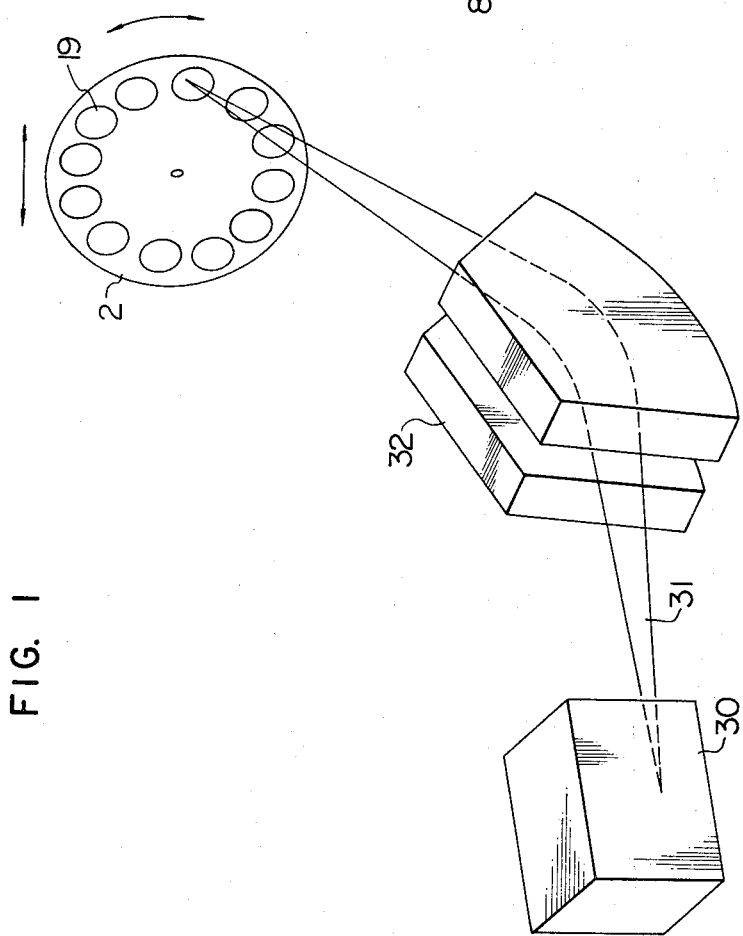
FIG. 1 schematically shows the manner in which ion implantation into the wafers attached to a rotary disc is carried out in an ion implantation system.

FIG. 1 shows the whole construction of an ion implantation system. The principles of ion implantation for semiconductor wafers loaded on a rotating disc will be explained hereunder with reference to this figure. In FIG. 1, various materials are ionized in an ion source 30 by microwave plasma discharge techniques. In more detail, gaseous materials are used to produce such ions as $B^+$ and $P^-$ and solid or liquid materials are used to obtain such ions as $Al^+$, $Ga^+$ and $As^-$. The ions thus produced are accelerated and emitted from the ion source 30 in the form of an ion beam 31 which is led into a magnetic field formed by a pair of electromagnets 32. The ion beam 31 is separated into groups by the magnetic field in accordance with mass number. A plurality of wafers 19 are affixed to an outer marginal portion of a disc 2 which is placed in an evacuated ion implant chamber and rotated in the direction of an arrow while moved in reciprocatory movement in the direction of a double arrow. Thus the electron beam is irradiated on the wafers 19 and uniformly implanted thereinto as the wafer-loaded rotary disc 2 is rotated while being moved in reciprocatory movement in the implant chamber.

As can be clearly seen from the foregoing description, the rotary member or disc 2 is supported in the evacuated chamber and moved in rotary movement and reciprocatory movement.

Figure 2:
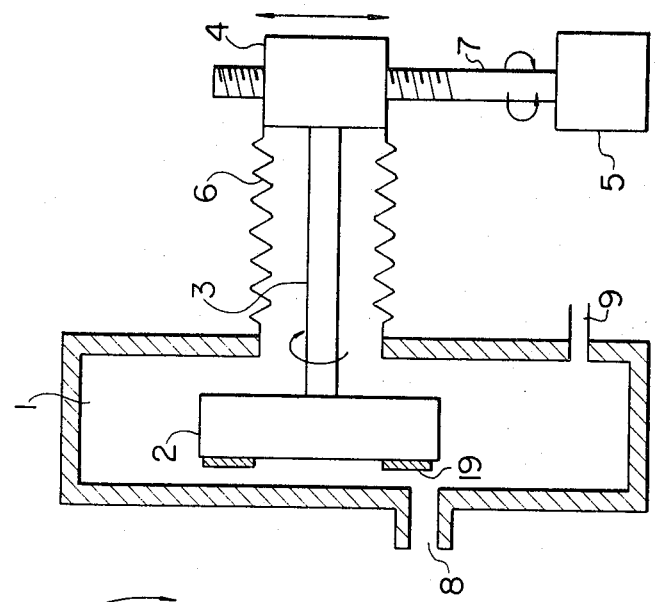
FIG. 2 is a schematic view of a system of the prior art for driving the rotary disc of an ion implantation system.

FIG. 2 shows system of the prior art for driving the rotary disc for rotary movement and reciprocatory movement in the evacuated chamber. In FIG. 2, the disc 2 supported on a rotary shaft 3 is located in an ion implant chamber or evacuated chamber 1. The rotary shaft 3 is driven for rotation by a motor 4 which is moved in the direction of a double arrow for reciprocatory movement by another motor 5 through a threaded rod 7. More specifically, rotation of the motor 5 either in the normal direction or in the reverse direction causes the threaded rod 7 to rotate, to thereby move the motor or disc rotating means 4 reciprocately as shown by the double arrow. At this time, a bellows 6 connecting the disc rotating means 4 to the evacuated chamber 1 in airtight relation is bent and deformed, to enable the disc 2 to move in reciprocatory movement in the plane of its rotation together with the rotary shaft 3. Thus the wafers 19 disposed in a plurality of positions on the outer marginal portion of the disc 2 equidistantly spaced apart circumferentially from one another and radially from the center of the disc 2 are irradiated with the ion beam admitted through an ion beam inlet port 8 into the evacuated chamber 1, to permit the ions to be implanted into the wafers 19 in uniform quantity.

Some disadvantages are associated with the aforesaid system for moving the disc 2 both in rotary movement and in reciprocatory movement. More specifically, the bellows 6 is repeatedly subjected to bending during operation in which the disc 2 is moved in rotary movement as well as in reciprocatory movement. Thus prolonged use of the bellows 6 might result in fatigue of the material, thereby causing cracks to be formed in the bellows 6 and making it impossible to provide an airtight seal to the evacuated chamber 1. When the wafers 19 have a large diameter, the range of the reciprocatory movement of the disc 2 should be increased. By using the bellows 6 of a large diameter and increased length, it is possible to reduce the amount of deformation of the bellows 6. However, such bellows 6 would be expensive, and an increase in the volume of the bellows 6 would entail an increase in the volume of air to be discharged from the chamber 1. This would increase the time required for evacuating the chamber 1 each time the wafers 19 are replaced by new ones, causing a drop in efficiency of operation.

SUMMARY OF THE INVENTION

A principal object of the invention is to provide a system for driving a rotary member supported in an evacuated chamber from outside for causing same to move both in rotary movement and in reciprocatory movement without disturbing the vacuum in the evacuated chamber while having a prolonged service life.

Another object is to provide a rotary member drive system wherein the moisture deposited on those parts of the drive system which are exposed to the atmosphere is prevented from being introduced in the evacuated chamber in which the wafer-loaded rotary member is supported, to thereby enable the interior of the evacuated chamber to be maintained at high vacuum level.

According to the invention, there is provided a system for driving a rotary member in vacuum comprising a first vacuum chamber in which the rotary member and a rotary shaft supporting the rotary member are rotatably inserted through a vacuum seal, a shield supporting the vacuum seal in the central portion and defining a part of the first vacuum chamber, a second vacuum chamber receiving a peripheral portion of the shield for sliding movement in airtight relation, support means in the second vacuum chamber for supporting the peripheral portion of the shield for sliding movement in airtight relation, means for rotating the rotary shaft, and means for reciprocately moving the shield in a manner to cause sliding movement of the peripheral portion of the shield within the second vacuum chamber, thereby causing through the vacuum seal and the rotary shaft reciprocatory movement of the rotary member in the plane of rotation of the latter.

Additional and other objects, features and advantages of the invention will become more apparent from the following description of the illustrated embodiment.

DETAILED DESCRIPTION OF THE PREFERRED EMBODIMENT

Figure 3:
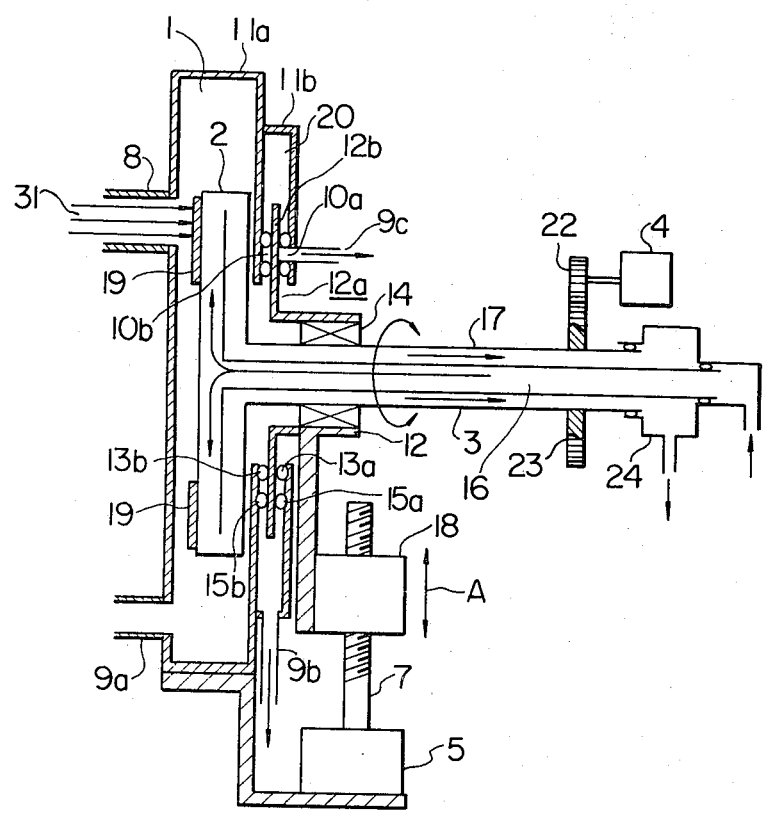
FIG. 3 is a vertical sectional view of the system for driving the rotary disc according to the invention for an ion implantation system.

FIG. 3 is a view in explanation of the system for driving a disc in accordance with a preferred embodiment of the invention, wherein parts similar to those shown in FIGS. 1 and 2 are designated by like reference characters. In this embodiment, a case 11a defining therein a first vacuum chamber 1 has connected thereto another case 11b defining therein a second vacuum chamber 20. A shield 12 having attached to its central portion a rotary seal or vacuum seal 14 supporting a rotary shaft 3 is secured at a flange of a plate-like peripheral portion 12a thereof to the case 11a through two pairs of O-rings 13a, 13b and 15a, 15b in such a manner that the peripheral portion 12a extends into the second vacuum chamber 20 which is hermetically sealed by the two pairs of O-rings 13a, 13b and 15a, 15b and maintained in vacuum as the chamber 20 is evacuated by drawing air through an air drawing port 9a. The O-rings 13a, 13b, 15a and 15b which hermetically seal the vacuum chamber 20 also serve as support means for supporting the peripheral portion 12b of the shield 12 for sliding movement. The first vacuum chamber 1 is opened when wafers 19 attached to a disc 2 supported at one end of the rotary shaft 3 are replaced by new ones. Thus the vacuum chamber 1 has air drawn therefrom through another air drawing port 9a provided separately from the air drawing port 9b for the second vacuum chamber 20 which is kept in vacua at all times. The air is drawn through the air drawing port 9a to achieve a high vacuum of $10^{-6}$–$10^{-7}$ Torr in the first vacuum chamber 1, while the air is drawn through the air drawing port 9b to achieve a low vacuum of about $10^{-1}$ Torr in the second vacuum chamber 20.

The case 11a is formed with an ion beam passage 8 communicating with the first vacuum chamber 1 through which an ion beam 31 is introduced into the first vacuum chamber 1 to irradiate the wafers 19 attached to an outer peripheral portion of the disc 2 in a plurality of positions equidistantly spaced apart from one another circumferentially and from the center of the disc 2 radially. The disc 2 is supported by the rotary shaft 3 to form a unit therewith and rotates as the rotary shaft 3 rotatably supported by the vacuum seal 14 is rotated by a rotary drive means or motor 14 through gears 22 and 23. The rotary shaft 3 is formed therein with a cooling water inlet passage 16 and a cooling water outlet passage 17 communicating with the interior of the disc 2 and disposed concentrically with the rotary shaft 3. Cooling water is introduced through a rotary joint 24 and the cooling water inlet passage 16 into the interior of the disc 2 from which it is returned through the cooling water outlet passage 17 to its source of supply. Thus a rise in the temperature of the disc 2 which might otherwise be caused by ion implantation can be avoided, to enable implantation of ions into the wafers 19 to be carried out uniformly and precisely.

The shield 12 which supports the rotary shaft 3 through the vacuum seal 14 has a connecting metal member 18 secured thereto to function as a unit therewith which threadedly engages a threaded rod 7 connected to a motor 5. Thus rotation of the motor 5 in one direction or in the other direction moves the connecting metal member 18 in reciprocatory movement in the direction of a double arrow A in the plane of FIG. 3, to thereby move the rotary shaft 3 up and down with the shield 12 and vacuum seal 14 in parallel with one another.

As aforesaid, the flange or plate-like peripheral portion 12b of the shield 12 which is slidably supported by the two pairs of O-rings 13a, 13b and 15a, 15b on opposite sides thereof is inserted in the second vacuum chamber 20. Although one of the two pairs of O-rings may be done without, the use of the two pairs of O-rings enables the two vacuum chambers 1 and 20 to be maintained in particularly desirable vacuum condition. Also, the provision of the O-rings 13a, 13b and 15a, 15b on opposite sides of the plate-like peripheral portion 12a of the shield 12 enables a satisfactory hermetical seal to be provided to the vacuum chambers 1 and 20 even if the shield 12 undergoes deformation and deflection during sliding movement of the shield 12. For example, when the shield 12 has its plate-like peripheral portion 12a deflected rightwardly in FIG. 3, the compressive force applied to the O-rings 13b and 15b on the left side of the peripheral portion 12a is reduced and the sealing effect achieved by these O-rings is reduced. However, the compressive force applied to the O-rings 13a and 15a on the right side of the peripheral portion 12b is increased, to thereby increase the sealing effect achieved by the O-rings 13a and 15a. Thus the second vacuum chamber 20 can be hermetically sealed as desired as it is positively isolated from the atmosphere, and at the same time the first vacuum chamber 1 can be maintained in high vacuum condition. Conversely, when the plate-like peripheral portion 12a of the shield 12 is deflected leftwardly in FIG. 3, the sealing effect achieved by the O-rings 13a and 15a is lessened but the sealing effect achieved by the O-rings 13b and 15b is increased. Thus the first vacuum chamber 1 can be maintained in high vacuum condition. In the illustrated embodiment, to fully realize the advantages offered by the aforesaid arrangement of the O-rings, the pair of O-rings 13a and 13b located radially inwardly of the peripheral portion 12b of the shield 12 and the pair of O-rings 15a and 15b located radially outwardly thereof are disposed in positions juxtaposed against each other through the shield 12.

In the illustrated embodiment, annular spaces 10a and 10b are formed between the O-rings 13a and 15a in the second vacuum chamber 20 disposed on the atmosphere side (right side of the peripheral portion 12b in FIG. 3) and between the O-rings 13b and 15b in the second vacuum chamber 20 disposed on the first vacuum chamber side (left side of the peripheral portion 12b in FIG. 3) respectively. The annular space 10a is evacuated as air is drawn through an air drawing port 9c. This ensures that a desired vacuum is achieved and maintained in the second vacuum chamber 20, to thereby effectively avoid a reduction in the vacuum achieved in the first vacuum chamber 1 in which ion implantation is carried out.

An added advantage offered by the illustrated embodiment is that a high vacuum can be maintained in the first vacuum chamber 1 more advantageously by avoiding introduction into the vacuum chamber 1 of moisture which might be deposited on the surfaces of the shield 12 and other parts exposed to the atmosphere. More specifically, the portion 12a of the shield 12 is exposed to the atmosphere and moisture tends to be deposited thereon. In the event that the moisture on the surface of the portion 12a of the shield 12 enters the vacuum chamber 1, the vacuum in the vacuum chamber 1 would be impaired. In the illustrated embodiment, the moisture deposited on the surface of the portion 12a of the shield 12 would only enter the second vacuum chamber 20 and would be prevented from entering the first vacuum chamber 1, when the shield 12 moves up and down as it is driven by the motor 5.

The embodiment of the system for driving a rotary member shown in FIG. 3 is constructed as aforesaid. The rotary shaft 3 is driven for rotation at all times by the motor 4 during operation for implantation of ions into the wafers 19. The rotary shaft 3 is moved up and down of FIG. 3 while being maintained in parallel with the shield 12 as the threaded rod 7 is moved in reciprocatory movement by the motor 5. Thus when the rotary shaft 3 is moved up and down, the shield 12 maintained in parallel with the shaft 3 moves as a unit therewith and the plate-like peripheral portion 12b of the shield 12 moves in reciprocatory movement in the second vacuum chamber 20 while moving in sliding movement along the surfaces of the two pairs of O-rings 13a, 13b and 15a, 15b. In this case, the first vacuum chamber 1 can be maintained in high vacuum condition in spite of the aforesaid movement of the shield 12, because the O-rings 13b and 15b, vacuum chamber 20, O-rings 13a and 15a the vacuum seal 14 are interposed between the first vacuum chamber 1 and the atmosphere. As described hereinabove, air is drawn from the annular space 10a through the air drawing port 9c. This is conductive to maintenance of the high vacuum in the first vacuum chamber 1 in still more desirable condition.

From the foregoing description, it will be appreciated that the second vacuum chamber 20 having the plate-like peripheral portion 12b of the shield 12 movably inserted thereinto is hermetically sealed by two pairs of O-rings, and the O-rings 13a and 15a define therebetween an annular space which is evacuated together with the second vacuum chamber. This ensures that the first vacuum chamber 1 or ion implanting chamber is kept in high vacuum condition. There is no risk of the hermetical seal being interferred with because the shield is supported by the O-rings which can provide an airtight seal for a prolonged period of time. The arrangement that the cooling water is circulated through the interior of the disc avoids a rise in the temperature of the wafer-loaded disc and increases the percision with which ion implantation is carried out.

In the illustrated embodiment, the disc 2 moved in reciprocatory movement in the plane of its rotation can cover a distance of about 10 cm. This distance represents an amount of movement which has been beyond the ability of the system using the bellows 6 shown in FIG. 2. Thus the invention permits implantation of ions into the wafers of large diameter to be effected with a high degree of efficiency, thereby making it possible to greatly increase the water treating capacity of an ion implantation system. The construction in which the shield 12 supporting the rotary shaft 3 through the vacuum seal 14 is moved in reciprocatory sliding movement in the second vacuum chamber 20 through the O-rings as aforesaid enables a disc drive mechanism of prolonged service life to be obtained in a system for driving a rotary member.

In the illustrated embodiment, two pairs of O-rings 13a, 13b and 15a, 15b are used and air is drawn from the annular space 10a defined between the two O-rings 13a and 15a on the atmosphere side. It is to be understood, however, that the invention is not limited to this specific number of the O-rings and that more than two pairs of O-rings may be used to define a plurality of annular spaces between the O-rings on the atmosphere side and to draw air from the plurality of annular spaces.

From the foregoing description, it will be appreciated that the system according to the invention for driving a rotary member supported in vacua from outside the vacuum chamber offers the advantages that it operates satisfactorily over a prolonged period of time to move the rotary member in reciprocatory movement in the plane of its rotation without the risk of the vacuum being interferred with and that it exhibits improved performance.

What is claimed is:

1. A system for driving a rotary member in vacuum, comprising:
    a first vacuum chamber in which said rotary member and a rotary shaft supporting said rotary member are rotatably inserted through a vacuum seal;
    a shield supporting said vacuum seal in the central portion and defining a part of said first vacuum chamber;
    a second vacuum chamber receiving a peripheral portion of said shield for sliding movement in airtight relation;
    support means in said second vacuum chamber for supporting the peripheral portion of said shield for sliding movement in airtight relation;
    means for rotating said rotary shaft; and
    means for reciprocately moving said shield in a manner to cause sliding movement of the peripheral portion of said shield within said second vacuum chamber, thereby causing through said vacuum seal and said rotary shaft reciprocatory movement of said rotary member in a plane of rotation of the latter.

2. A system as claimed in claim 1, wherein said support means comprises at least one pair of O-rings arranged in said second vacuum chamber in a relation opposed to each other through the peripheral portion of said shield.

3. A system as claimed in claim 1, wherein said support means comprises a plurality of pairs of O-rings arranged in said second vacuum chamber, said plurality of pairs of O-rings including a first pair of O-rings disposed in juxtaposed relation on opposite sides of a first segment of the peripheral portion of said shield and a second pair of O-rings disposed in juxtaposed relation on opposite sides of a second segment of the peripheral portion of said shield spaced radially outwardly from said first segment, and further comprising means for evacuating an annular space defined between the atmosphere side O-ring of said first pair of O-rings and the atmosphere side O-ring of said second pair of O-rings.

4. A system as claimed in claim 1, further comprising means for introducing cooling water into said rotary member for cooling the same, said cooling means including cooling water passages formed in said rotary shaft and communicated with the interior of said rotary member.

5. A system as claimed in any one of claims 1 to 4, wherein said rotary member is a wafer-loaded disc of a system for implanting ions.

* * * * *